(12) United States Patent
Liu

(10) Patent No.: US 7,553,055 B2
(45) Date of Patent: Jun. 30, 2009

(54) SYSTEMS FOR DISPLAYING IMAGES

(75) Inventor: Cheng-Hung Liu, Taipei (TW)

(73) Assignee: TPO Displays Corp., Chu-Nan (TW)

( * ) Notice: Subject to any disclaimer, the term of this patent is extended or adjusted under 35 U.S.C. 154(b) by 0 days.

(21) Appl. No.: 11/508,056

(22) Filed: Aug. 21, 2006

(65) Prior Publication Data

US 2007/0133221 A1   Jun. 14, 2007

Related U.S. Application Data

(60) Provisional application No. 60/748,814, filed on Dec. 8, 2005.

(51) Int. Cl.
*F21V 7/04* (2006.01)
(52) U.S. Cl. ........................ 362/600; 362/294; 362/373; 361/720
(58) Field of Classification Search ................. 362/600, 362/612, 307, 631, 294, 373, 561; 361/719, 361/720
See application file for complete search history.

(56) References Cited

U.S. PATENT DOCUMENTS

| 6,499,865 | B1 * | 12/2002 | Wada | .......................... | 362/307 |
| 6,920,046 | B2 * | 7/2005 | Spryshak | ..................... | 361/704 |
| 7,175,329 | B1 * | 2/2007 | Chou | .......................... | 362/612 |
| 2002/0001192 | A1 | 1/2002 | Suehiro et al. | | |
| 2005/0157500 | A1 | 7/2005 | Chen et al. | | |

FOREIGN PATENT DOCUMENTS

| CN | 1655346 | 8/2005 |
| TW | 229725 | 4/1994 |
| TW | 200528666 | 6/2004 |

* cited by examiner

*Primary Examiner*—John A Ward
(74) *Attorney, Agent, or Firm*—Liu & Liu

(57) ABSTRACT

Systems for displaying images are provided. An embodiment of a system comprises a liquid crystal display module, and the liquid crystal display module comprises a backlight assembly. The backlight module primarily includes a circuit board and at least an LED disposed on a first planar side of the circuit board. The circuit board comprises at least a hole and a heat conductor extending through the hole. Heat from the LED on the first planar side is dissipated to a second planar side of the circuit board by the heat conductor through the hole.

18 Claims, 5 Drawing Sheets

SYSTEMS FOR DISPLAYING IMAGES

This application claims the benefit of the priority of Provisional Patent Application No. 60/748,814, which was filed Dec. 8, 2005. This provisional application is fully incorporated by reference, as if fully set forth herein.

BACKGROUND OF THE INVENTION

1. Field of the Invention

The invention relates in general to liquid crystal display (LCD) technology, and in particular to a system for displaying images with improved heat dissipation efficiency.

2. General Discussion of Related Art

With the progress of semiconductor and flat panel display manufacturing technology, traditional Cathode Ray Tube (CRT) displays have increasingly been replaced by flat panel displays having small size and low radiation, such as liquid crystal displays. Conventional florescent lamps are used as the light sources in liquid crystal displays. However, the florescent lamps have large dimension and short life of usage.

With efficacies of durability, small size and light weight greater than conventional florescent lamps, LEDs have been widely used in liquid crystal displays as light sources. Since life and brightness of LEDs are greatly influenced by the temperature, heat dissipation becomes very important.

BRIEF SUMMARY OF THE INVENTION

The present invention overcomes the deficiencies in the prior art by providing heat dissipation in display device that incorporates LEDs as light sources. In one aspect of the present invention, heat dissipation is provided through the circuit board that supports the LEDs. Heat conductive material penetrates through the circuit board to facilitate heat conduction from a first planar side on which the LEDs are mounted, to a second planar side of the circuit board. A heat sink may be provided on the second planar side, which may be a frame of the display device. A heat conductive layer may be provided between the second planar side and the heat sink, which heat conductive layer may also function as an insulating layer between the second planar side and the frame. In another aspect of the present invention, the heat conductive material may be a part of conductive traces in the circuit board, providing power to the LEDs.

A detailed description is given in the following embodiments with reference to the accompanying drawings. Systems for displaying images are provided. An embodiment of a system comprises a liquid crystal display module, and the liquid crystal display module comprises a backlight assembly. The backlight module primarily includes a circuit board, an LED and a thermal conductive member. The circuit board comprises at least a hole disposed on a first side of the circuit board and a conductor exposed on a second side of the circuit board, opposite to the first side, wherein the conductor extends through the hole to the first side. The LED is disposed on the first side of the circuit board and electrically connected to the conductor. The thermal conductive member connects the conductor from the second side of the circuit board.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
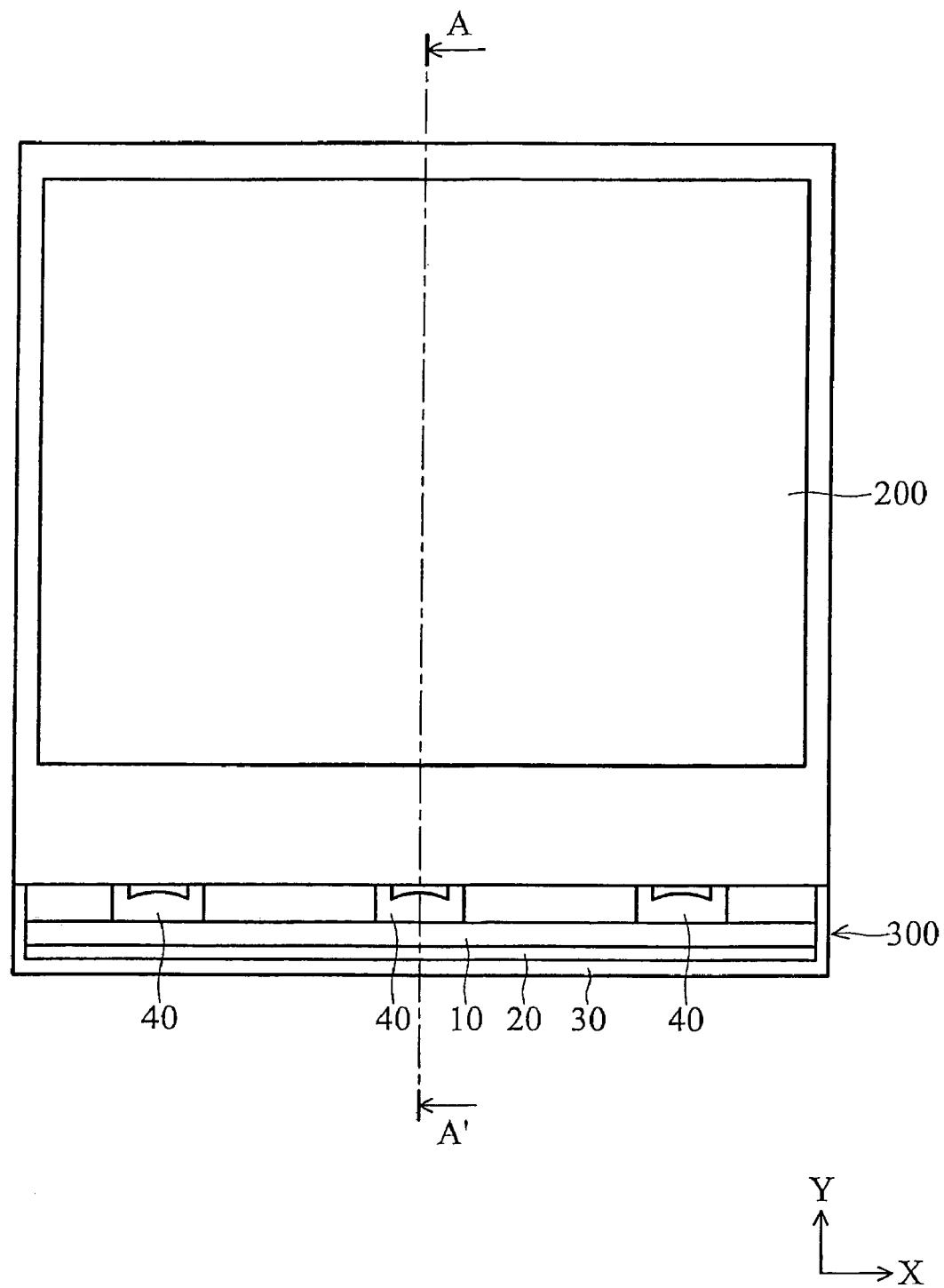
FIG. 1 is a perspective diagram of an embodiment of a liquid crystal display module.
Figure 2:
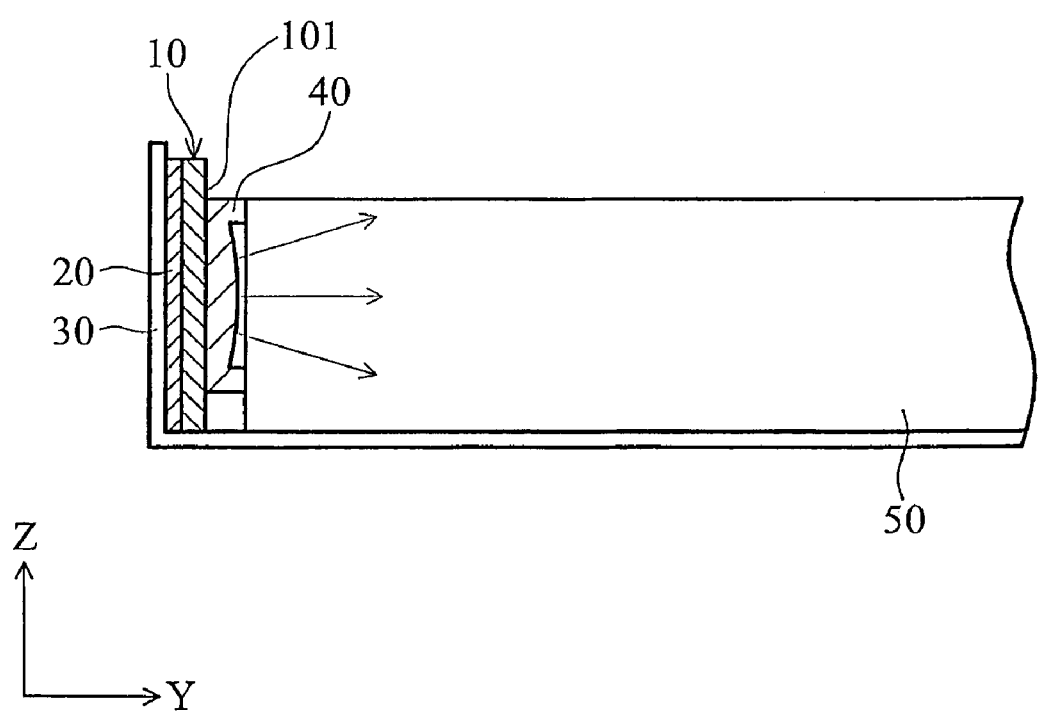
FIG. 2 is a sectional view taken along line A-A' in FIG. 1.
Figure 3:
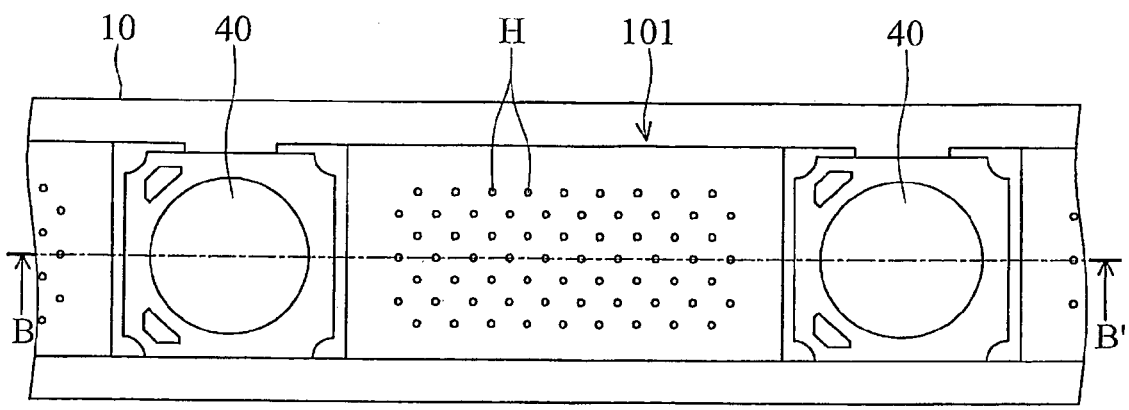
FIG. 3 is a side view of the backlight assembly along Y axis.
Figure 4:
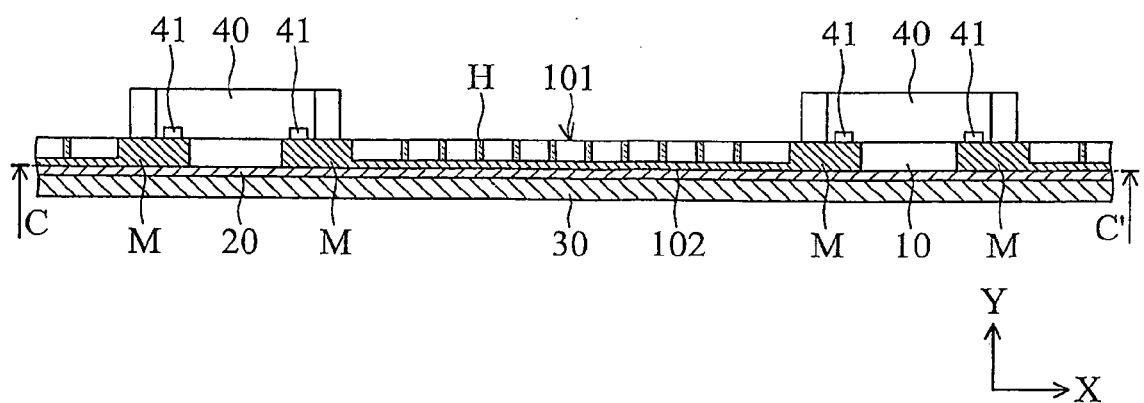
FIG. 4 is a sectional view taken along line B-B' in FIG. 3.
Figure 5:
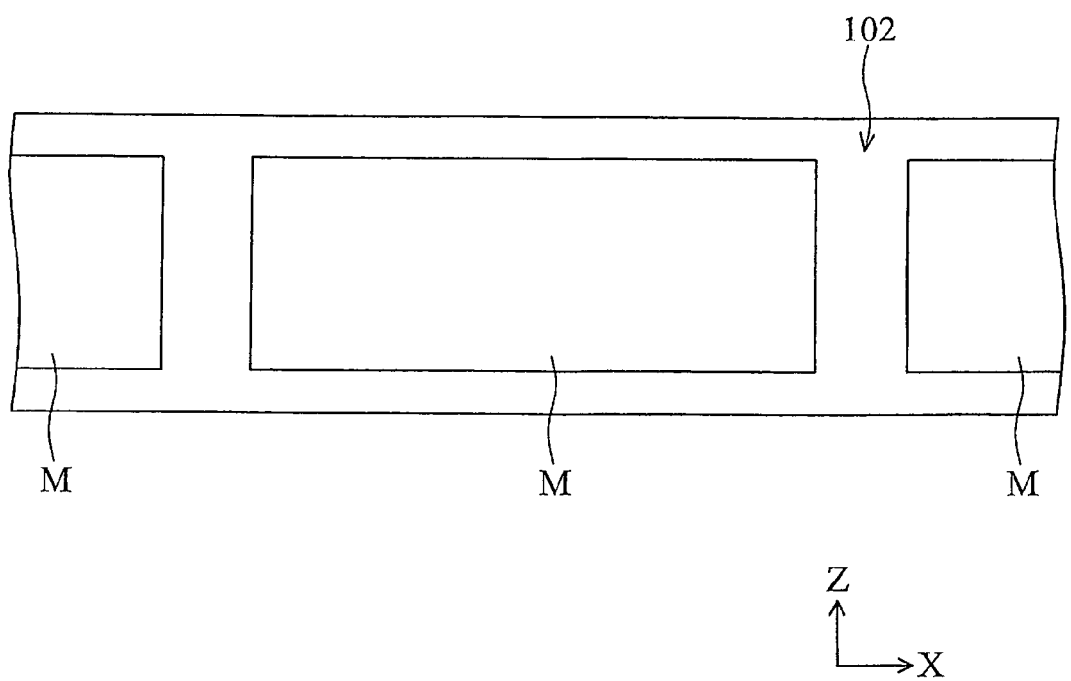
FIG. 5 is a bottom view of the second side of the circuit board in FIG. 4, taken alone line C-C'.

Embodiments of a system for displaying images are provided, comprising a liquid crystal display module 100. In this regard, FIG. 1 and FIG. 2 depict a liquid crystal display module 100 primary comprises a liquid crystal display panel 200 and a backlight assembly 300 disposed on a planar side thereof. The liquid crystal display panel 200 is illuminated by the backlight assembly 300 for rendering images. The backlight assembly 300 primarily comprises a circuit board 10, a thermal conductive member 20, a frame 30 fixed to a light guide 50, and at least an LED 40 (e.g., a linear array of LEDs 40 as shown in FIG. 1). As depicted in FIG. 2, the LEDs 40 are disposed on a first side 101 of the circuit board 10 and emit light into the light guide 50 of the backlight assembly 300. Heat from the LEDs 40 can build up in the space between the circuit board 10 and the side of the light guide 50, as seen in FIG. 2. The thermal conductive member 20 thermo-conductively connects the circuit board 10 and the frame 30, to rapidly transfer heat from the circuit board 10 to the frame 30. In some embodiments, the frame 30 can be a heat sink comprising copper or aluminum to enhance heat dissipation. As shown in FIGS. 3 and 4, the circuit board 10 of the backlight assembly 300 comprises a plurality of holes (e.g., an array of holes H) through the circuit board 10, leading from the first side 101 to a second side 102 of the circuit board 10. A plurality of electrical conductors M (e.g., made of metals), are in physical contact with the thermal conductive member 20 on the second side 102 of the circuit board 10, opposite to the first side 101. The conductors M are also good thermal conductors. In this embodiment, the holes H are disposed on the circuit board 10 between the LEDs 40, and portions of the conductors M fill the holes H and extend through the holes H from the second side 102 to the first side 101, enhancing heat transfer from the first side 101 to the second side 102 of the circuit board 10. The ends of the conductors M that are exposed through the holes H are not connected to any circuit device (e.g., not connected to capacitors, chips, etc.). That is, the portions of the conductors M through the holes H facilitate heat dissipation between the sides 101 and 102 of the circuit board 10, but these portions are not for interlayer electrical connection. In the alternate embodiment, the exposed ends of the conductors M may be thermal coupled to a heat conductor on the first side 101 of the circuit board (not shown). In this embodiment, each of the conductors M is also a part of an electronic circuit on the circuit board 10, such as a copper laminate, and electrically connects the terminals 41 of two LEDs 40 to provide power to the LEDs 40. In the alternative, the conductors M do not interconnect the LEDs 40, but are separate from the LEDs 40, to provide purely a heat dissipation function, and no providing power to the LEDs. As shown in FIG. 5, since the conductors M are exposed to a large area on the second side 102 and in contact with the thermal conductive member 20, heat dissipation efficiency of the backlight assembly 300 is significantly improved.

Figure 6:
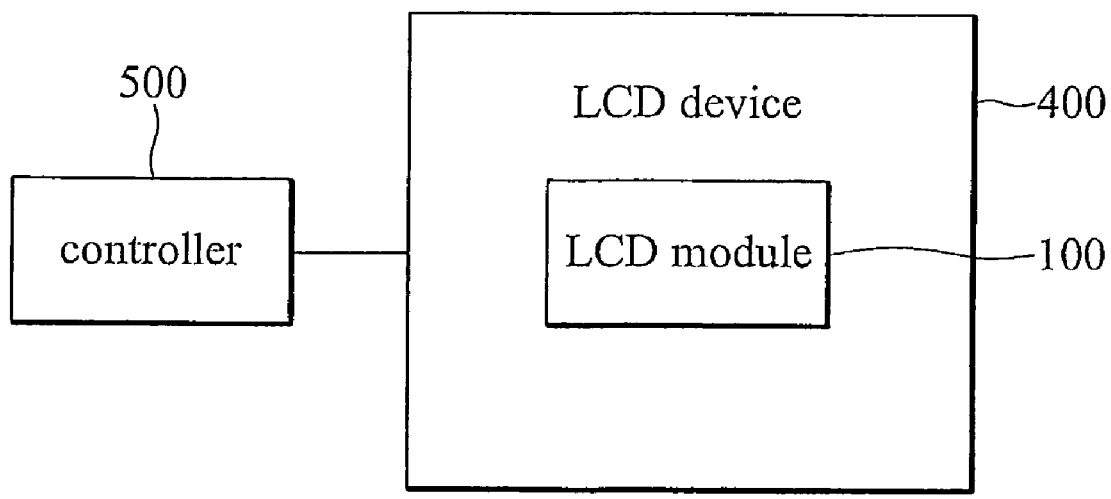
FIG. 6 is a perspective diagram of a system for displaying images.

The thermal conductive member 20 may comprise ceramic or epoxy, acting as an electrical insulator and a thermal conductor. Here, the thermal conductive member 20 not only electrically insulates the frame 30 (which may be made of metal) from the circuit board 10, but also facilitates rapid heat transfer from the circuit board 10 to the frame 30. In some embodiments, the thermal conductive member 20 may have a three-layer structure including three thermal conductive layers, wherein the first and third layers are also electrically insulative (not shown). The two electrically insulating layers may comprise silicon to electrically insulate between the frame 30 and the circuit board 10, and the thermal conductive layer disposed therebetween may comprise metal or ceramic material to enhance heat transfer from the circuit board 10 to the frame 30. FIG. 6 schematically shows an embodiment of a system for displaying images which is implemented as an LCD device 400 or an electronic device 600 incorporating such an LCD device 400. The electronic device may include a laptop computer, a mobile phone, a digital camera, a personal digital assistant (PDA), a desktop computer, a television, a car display or a portable DVD player. As shown in FIG. 6, the LCD device 400 may comprise an LCD module 100 shown in FIG. 1. As shown in FIG. 6, the electronic device 600 may comprise a controller 500. The controller 500 is operatively coupled to the LCD device 400 and provides input signals (e.g. image signals) and/or control signals thereto for generating images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
a liquid crystal display module, comprising:
a backlight assembly optically coupled to the liquid crystal display module, comprising:
a circuit board, comprising at least a hole through the circuit board between a first planar side and a second planar side, and a heat conductor extending through and filling the hole from the second side to the first side,
a thermal conductive member in contact with the heat conductor on the second side of the circuit board, wherein the thermal conductive member includes two electrically insulating layers and a thermal conductive layer disposed therebetween, and
an LED, disposed on the first side of the circuit board, wherein heat from the LED on the first side is dissipated to the second side by the heat conductor through the hole.

2. The system as claimed in claim 1, wherein the backlight assembly further comprises a plurality of LEDs, wherein the circuit board comprises a plurality of holes between the LEDs through which the heat conductor extends.

3. The system as claimed in claim 2, wherein the conductor also conducts electricity, and wherein the conductor electrically connects two of the LEDs.

4. The system as claimed in claim 1, wherein the conductor is part of an electronic circuit of the circuit board.

5. The system as claimed in claim 1, wherein the thermal conductive member comprises at least one of ceramic material, adhesive material, and epoxy material.

6. The system as claimed in claim 1, wherein the backlight assembly further comprises a frame in contact with the thermal conductive member, whereby heat is dissipated from the thermal conductive member to the frame.

7. The system as claimed in claim 6, wherein the frame comprises copper.

8. The system as claimed in claim 6, wherein the frame comprises aluminum.

9. The system as claimed in claim 1, wherein the electrically insulating layers comprises silicon.

10. The system as claimed in claim 1, wherein the thermal conductive layer comprises metal.

11. The system as claimed in claim 1, wherein the thermal conductive layer comprises ceramic material.

12. The system as claimed in claim 1, wherein diameter of the hole is at least 0.3 mm.

13. The system as claimed in claim 1, wherein the circuit board comprises a plurality of holes, and space between two of the holes is at least 0.3 mm.

14. The system as claimed in claim 1, further comprising:
a liquid crystal display device comprising the liquid crystal display module; and
a controller coupled to the liquid crystal display device, being operative to control the liquid crystal display module to render images in accordance with an image data.

15. The system as claimed in claim 14, wherein the system comprises an electronic device comprising the liquid crystal display device.

16. The system as claimed in claim 15, wherein the electronic device is a laptop computer, a mobile phone, a digital camera, a personal digital assistant (PDA), a desktop computer, a television, a car display or a portable DVD player.

17. A liquid crystal display module, comprising:
a backlight assembly optically coupled to the liquid crystal display module, comprising:
a linear array of LEDs,
a circuit board supporting the linear array of LEDs, wherein an array of holes is provided in the circuit board between two LEDs and between a first planar side and a second planar side, and the array of holes are filled with a heat conductive material, with no connection to any circuit device on the first planar side, whereby heat from the array of LEDs is dissipated from the first planar side to the second planar side through the heat conductive material in the array of holes, and
a thermal conductive member in contact with the heat conductive material on the second side of the circuit board, wherein the thermal conductive member includes two electrically insulating layers and a thermal conductive layer disposed therebetween.

18. The system as claimed in claim 1, wherein the LCD is disposed entirely and having its base on the first planar side of the circuit board.

* * * * *